(12) United States Patent
Kondo et al.

(10) Patent No.: US 6,812,499 B2
(45) Date of Patent: Nov. 2, 2004

(54) SILICON-BASED FILM AND PHOTOVOLTAIC ELEMENT

(75) Inventors: Takaharu Kondo, Kyoto (JP); Makoto Higashikawa, Nara (JP); Masafumi Sano, Kyoto (JP); Koichi Matsuda, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/982,845

(22) Filed: Oct. 22, 2001

(65) Prior Publication Data

US 2002/0117661 A1 Aug. 29, 2002

(30) Foreign Application Priority Data

Oct. 24, 2000 (JP) .......................... 2000-323521

(51) Int. Cl.[7] .......................... H01L 33/00; H01L 31/00; H01L 35/28
(52) U.S. Cl. .......................... 257/95; 136/258; 136/255; 136/253; 136/203
(58) Field of Search .............. 136/258, 255, 136/253, 203; 257/95

(56) References Cited

U.S. PATENT DOCUMENTS

| | | | |
|---|---|---|---|
| 4,721,535 A | * 1/1988 | Itoh et al. ................... 136/249 |
| 4,892,594 A | * 1/1990 | Fujiwara et al. ............. 136/258 |
| 5,066,340 A | * 11/1991 | Iwamoto et al. ............ 136/258 |
| 5,387,542 A | 2/1995 | Yamamoto et al. ......... 437/101 |
| 5,492,142 A | * 2/1996 | Sano .......................... 136/258 |
| 5,682,037 A | * 10/1997 | de Cesare et al. ...... 250/370.01 |
| 5,981,934 A | 11/1999 | Higashikawa ............... 250/214 |
| 6,165,844 A | * 12/2000 | Chang ........................ 438/260 |
| 6,187,150 B1 | * 2/2001 | Yoshimi et al. ............. 136/252 |
| 6,211,454 B1 | 4/2001 | Sano .......................... 136/258 |

FOREIGN PATENT DOCUMENTS

| | | |
|---|---|---|
| JP | 5-109638 | 4/1993 |
| JP | 5-136062 | 6/1993 |
| JP | 11-274530 | 10/1999 |
| JP | 11-274539 | 10/1999 |

* cited by examiner

*Primary Examiner*—Ori Nadav
*Assistant Examiner*—Samuel A Gebremariam
(74) *Attorney, Agent, or Firm*—Fitzpatrick, Cella, Harper & Scinto

(57) ABSTRACT

A silicon based film is provided which comprises a crystal phase formed on a substrate with a surface shape represented by a function f, wherein the silicon-based film is formed on a substrate with a surface shape having a standard deviation of an inclination arctan (df/dx) from 15° to 55° within the range of a sampling length dx from 20 nm to 100 nm. Raman scattering strength resulting from an amorphous component in the silicon-based film is not more than a Raman scattering strength resulting from a crystalline component. A difference between a spacing in a direction parallel to a principal surface of the substrate and a spacing of a single crystal silicon is within the range of 0.2% to 1.0% with regard to the spacing of the single crystal silicon.

13 Claims, 7 Drawing Sheets

SILICON-BASED FILM AND PHOTOVOLTAIC ELEMENT

BACKGROUND OF THE INVENTION

1. Field of the Invention

The present invention relates to a silicon-based film and a photovoltaic element comprising a silicon-based semiconductor layer with at least one pin junction on a support, such as a solar cell, a sensor and the like.

2. Related Background Art

As a method of forming a silicon-based film showing crystallinity, some methods like the cast method in which the film is grown in a liquid phase have been conventionally carried out, but these methods require high temperature processing and have some problems in achieving mass production and low-cost production.

Some methods of forming a silicon-based film showing crystallinity other than the cast method have been disclosed. These methods include a method described in Japanese Patent Application Laid-Open No. 5-109638 in which a polycrystalline silicon film is formed by growing an amorphous silicon film in a solid phase and a method described in Japanese Patent Application Laid-Open No. 5-136062 in which after amorphous silicon film has been formed, hydrogen plasma processing is carried out, and a polycrystalline silicon film is formed by repeating the procedure.

However, in these disclosed methods of forming a silicon-based film showing crystallinity, the former method has the problem that a prolonged heat treatment is needed to crystallize a semiconductor layer with a thickness of several $\mu$m or more using a solid phase reaction, and the latter method has the problem of increased processing time due to the repetition of hydrogen plasma processing and the formation of a silicon film.

Furthermore, when a substrate having an uneven surface shape is adopted as a means of increasing the optical confinement effect in a silicon-based film showing an orientation property, especially in a silicon-based film having a columnar structure in the thickness direction, the growth of an orientation plane in the tangential direction of the unevenness in the early stage of the film formation results in the generation of irregular crystal boundaries in the growing process.

SUMMARY OF THE INVENTION

Accordingly, an object of the present invention is to provide a silicon-based film which addresses the above described problems. In particular, it is an object of the invention to provide a high-quality silicon-based film that can be formed at a low cost and at a high film forming rate, with a processing time of an industrially acceptable level, especially on a substrate having an uneven surface shape. It is also an object of the invention to provide a photovoltaic element that has such a silicon-based film and is excellent in photoelectric characteristics.

The silicon-based film of the present invention comprises a crystal phase formed on a substrate with a surface shape represented by a function f, wherein the silicon-based film is formed on a substrate with a surface shape having a standard deviation of an inclination arctan (df/dx) from 15° to 55° within the range of a sampling length dx from 20 nm to 100 nm. A Raman scattering strength resulting from an amorphous component in the silicon-based film is not more than a Raman scattering strength resulting from a crystalline component. A difference between a spacing in a direction parallel to a principal surface of the substrate and a spacing of single crystal silicon is within the range of 0.2% to 1.0% with regard to the spacing of the single crystal silicon.

Further, the present invention provides a silicon-based film that is characterized in that the above described silicon-based film having a crystal phase comprises a crystal of a columnar structure in the thickness direction.

Furthermore, the present invention provides a silicon-based film that is characterized in that the percentage of diffraction strength of (220) plane according to X-ray or electron beam diffraction is 30% or more of the total diffraction strength.

Moreover, the present invention provides a photovoltaic element that is characterized in that in a photovoltaic element comprising a silicon-based semiconductor layer having at least one pin junction on a support, at least one i-type semiconductor layer comprises the above described silicon-based film.

In addition, the present invention provides a photovoltaic element that is characterized in that the above described silicon-based semiconductor layer is formed on a substrate comprising at least a first transparent conductive layer stacked on a support. The first transparent conductive layer has the above described surface shape.

Further, the present invention provides a photovoltaic element that is characterized in that the above described silicon-based film is prepared by a plasma CVD method using a high frequency.

The high frequency is preferably not less than 10 MHz and no more than 10 GHz. The above-described support is preferably a conductive support.

DESCRIPTION OF THE PREFERRED EMBODIMENTS

Figure 1:
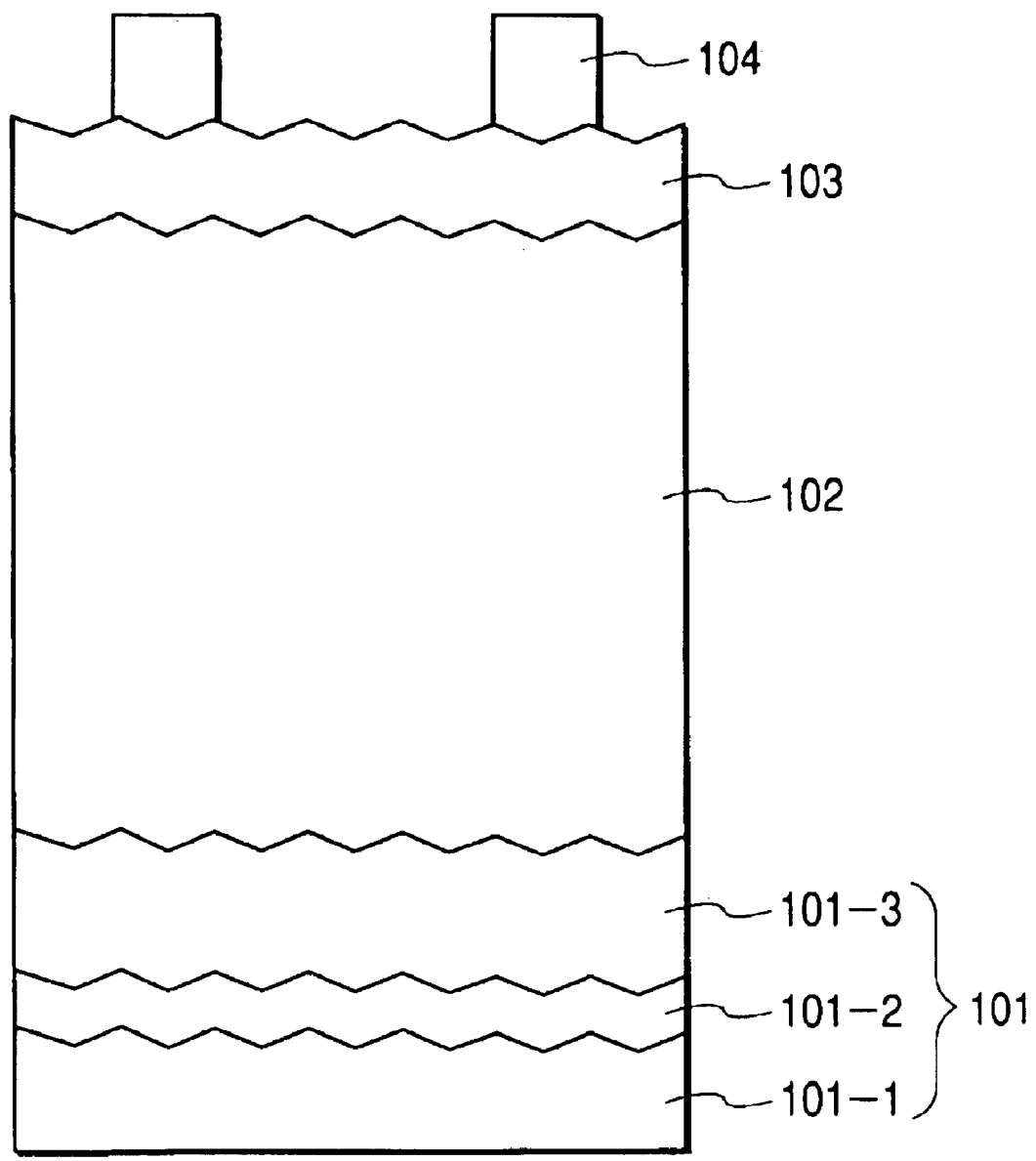
FIG. 1 is a schematic sectional view showing one example of a photovoltaic element of the present invention.

The present inventors have found that it is possible to a silicon-based film comprising a crystal phase with low defect density and good quality, even on a substrate with an uneven surface shape. This silicon-based film is formed on a substrate in which the standard deviation of the inclination arctan (df/dx) is from 15° to 55° in the range where the sampling length dx of the cross-sectional shape f of the surface is from 20 nm to 100 nm, a Raman scattering strength resulting from an amorphous component in the silicon-based film is not more than a Raman scattering-strength resulting from a crystalline component, and the difference between the spacing in the direction parallel to the principal surface of the above described substrate (a macroscopic and virtual substrate surface obtained by ignoring the unevenness of the surface) and the spacing of single crystal silicon is within the range of 0.2% to 1.0% to the spacing of single crystal silicon. The inventors have also found that in a photovoltaic element formed with the use of such a silicon based film, because good photoelectric conversion characteristics can be obtained, a factor of generating cracks in the film is suppressed, and the formed surface is cleansed. The photovoltaic element is improved in its adhesion with the substrate and shows good environmental resistance.

A method of forming a silicon-based semiconductor film comprising a crystal phase by the plasma CVD method using a high frequency is advantageous in achieving low-cost production as compared to a solid phase reaction because the process time can be shortened and the process temperature can also be lowered. In particular, in a photovoltaic element having a pin junction, this method is beneficial when applied to an i-type semiconductor layer with a greater film thickness.

When an i-type semiconductor layer substantially functioning as a light absorbing layer is an i-type semiconductor layer comprising a crystal phase, a photodegradation phenomenon due to the Staebler-Wronski effect, which becomes a problem in case of an amorphous material, can be restrained. The present inventors have conducted studies and have found that the Staebler-Wronski effect appears more remarkably in an i-type semiconductor layer formed so that a Raman scattering strength resulting from an amorphous component (a typical example is in the vicinity of 480 cm$^{-1}$) is not more than a Raman scattering strength resulting from a crystalline component (a typical example is in the vicinity of 520 cm$^{-1}$).

Here, with regard to an i-type semiconductor layer comprising a crystal phase, it is known that grain boundaries have influences on both major carriers and minority carriers to deteriorate their performance. In order to restrain the influences of grain boundaries, one effective means is to lower the crystal grain boundary density by making the crystal grain size in an i-type semiconductor layer larger.

Further, when carrier travel occurs in the thickness direction, a constitution in which columnar crystal grains are arranged in the thickness direction is more preferable than a constitution in which crystal grains are randomly arranged because it is possible to lower the frequency of carriers having to cross grain boundaries. In particular, when columnar crystal grains are selectively oriented on (220) plane, the surface is considered to function as an i-type semiconductor layer in which the mobility of the carrier is improved, because the crystal grains have the channel structure of a hexagon form in the direction perpendicular to the substrate surface. As is clearly seen from ASTM cards, the percentage of diffraction strength in the (220) plane to the total amount of diffraction strength of 11 reflection parts from a low angle side is about 23% in non-orientating crystalline silicon. That is, a crystalline silicon-based film in which the percentage of diffraction strength on (220) plane is over 23% has an orientation property in the direction of (220) plane. In particular, in the structure in which the percentage of diffraction strength on (220) plane is 30% or more, the effect of improving the mobility of a carrier is considered to be greater.

Moreover, because the sensitivity (especially in the longer wavelength side) is increased owing to the optical confinement effect by forming the above described silicon-based semiconductor film on an uneven shape, when an i-type semiconductor layer that practically functions as a light absorbing layer in a photovoltaic element is formed on the above described uneven shape, the thin film formation of an i-type semiconductor layer is possible. In particular, in order to estimate the optical confinement effect to light in the visible light region, it has been found that the optical confinement effect becomes more conspicuous by examining the distribution of the inclination arctan (df/dx) in the range where the sampling length dx of the cross-sectional shape f of the surface is from 20 run to 100 nm and making the shape with the standard deviation of 15° to 55°.

On the other hand, when a silicon-based film showing an orientation property and comprising a columnar structure in the thickness direction is formed on the above described uneven shape, because the columnar structure grows in the direction normal to the unevenness of the substrate, the collision of crystal grains and the like occur in the growth process and structural unmatching (inconsistency) results. In the case of a silicon-based film in which a Raman scattering strength resulting from an amorphous component does not exceed a Raman scattering strength resulting from a crystalline component, it is more difficult to absorb the structural unmatching in the film forming process as compared to the case of a silicon-based film comprising an amorphous component more abundantly. The amorphous component makes the structure more flexible.

Furthermore, the degree of relaxing the structural unmatching by the volume diffusion and the surface diffusion effected using the surface chemical potential induced by recesses and protrusions as a driving force is also low in the tetra-coordination structure (like a diamond structure represented by a silicon-based film) as compared to those in single cubic lattice of hexa-coordination, body-entered cubic lattice of octa-coordination, face-centered cubic lattice of dodeca-coordination and others. For that purpose, in case of a silicon-based film in which a Raman scattering strength resulting from an amorphous component does not exceed a Raman scattering strength resulting from a crystalline component, it is effective to relax the structural unmatching by changing the ratio of lattice constants in the directions parallel to and perpendicular to the growing surface and by changing the crystal structure to a pseudo-tetragonal crystal structure.

Hereby, it is possible to retard the generation of irregular grain boundaries and dislocations among crystal grains. Through retarding the generation of these regions of no crystallographical regularity, the lowering of electric activity in grain boundaries and the retarding of the generation of dangling bonds within the bulk are realized. As a result, it becomes possible to improve the mobility of carriers through a silicon-based film.

However, when the lattice constants are changed, if the degree of the change is too large, the mobility of carriers will be lowered because of inducing point defects within the bulk. Furthermore, when the above described standard deviation is smaller than 15°, the i-type semiconductor layer must be made relatively thick because the optical confinement effect is weak. When the above described standard deviation is over 55°, a steep peak appears, which creates a problem that local stress within the silicon-based film is generated. Moreover, within the standard deviation of 15° to 55°, it is more preferable to be 20° to 50°, and further more preferable to be 25° to 40°.

The present inventors have conducted studies and have found that the area of a silicon-based film, in which the optical confinement effect is achieved, the mobility of carriers within the bulk is favorably maintained and no local stress is generated, is formed on the surface of a substrate where the above described standard deviation is 15° to 55°, and is such an area that the difference between the spacing in the direction parallel to the principal surface of the above described substrate in the above described silicon-based film and the spacing of single crystal silicon is within the range of 0.2% to 1.0% on the basis of the spacing of the single crystal silicon.

A method of preparing a substrate that has the surface shape in which the standard deviation of the inclination arctan (df/dx) is 15° to 55° in the range where the sampling length dx of the cross-sectional shape f of the surface is from 20nm to 100 nm will be explained. A substrate comprised of a SUS substrate, a metal layer and the first transparent conductive layer will be used as an example. An uneven shape may be formed on all of these layers or an uneven shape may be formed on only part of them, as long as the final surface shape meets the above described conditions.

As a method of making an uneven shape on the surface of a SUS substrate, the following methods can be included: a method in which heat treatment, acid cleaning and the like are conducted after cold rolling, a rolling method using a roll with a mechanically roughened surface, a grinding method using a belt on which abrasive is applied, methods in which the above methods are combined, and others. As a method of making unevenness on the surface of a metal layer, the following methods can be included: a vapor deposition method of a metal layer on a substrate heated to high temperature, a forming method with the use of a sputtering method, an electrodeposition method, a printing method and others. As a method of making unevenness on the surface of the first transparent conductive layer, the following methods are included: a vapor deposition method of the first transparent conductive layer on a substrate heated to high temperature, a forming method with the use of a sputtering method, an electrodeposition method with the use of a solution containing nitric ions and zinc ions (the concentration is 0.001 to 1.0 mol/L, and the liquid temperature is 5° C. or more) and the like, a printing method and others. When unevenness is made on the surface of the first transparent conductive layer with a sputtering method, it is also effective to introduce oxygen into the feed gas in the early stage of formation. Further, in each process using these methods, grinding by dry etching, wet etching, sandblasting and the like, heat treatment and others may be added. In the case of using wet etching, the standard deviation can be controlled by controlling wet time. The value of the standard deviation will be increased as the passage of wet time.

Figure 6:
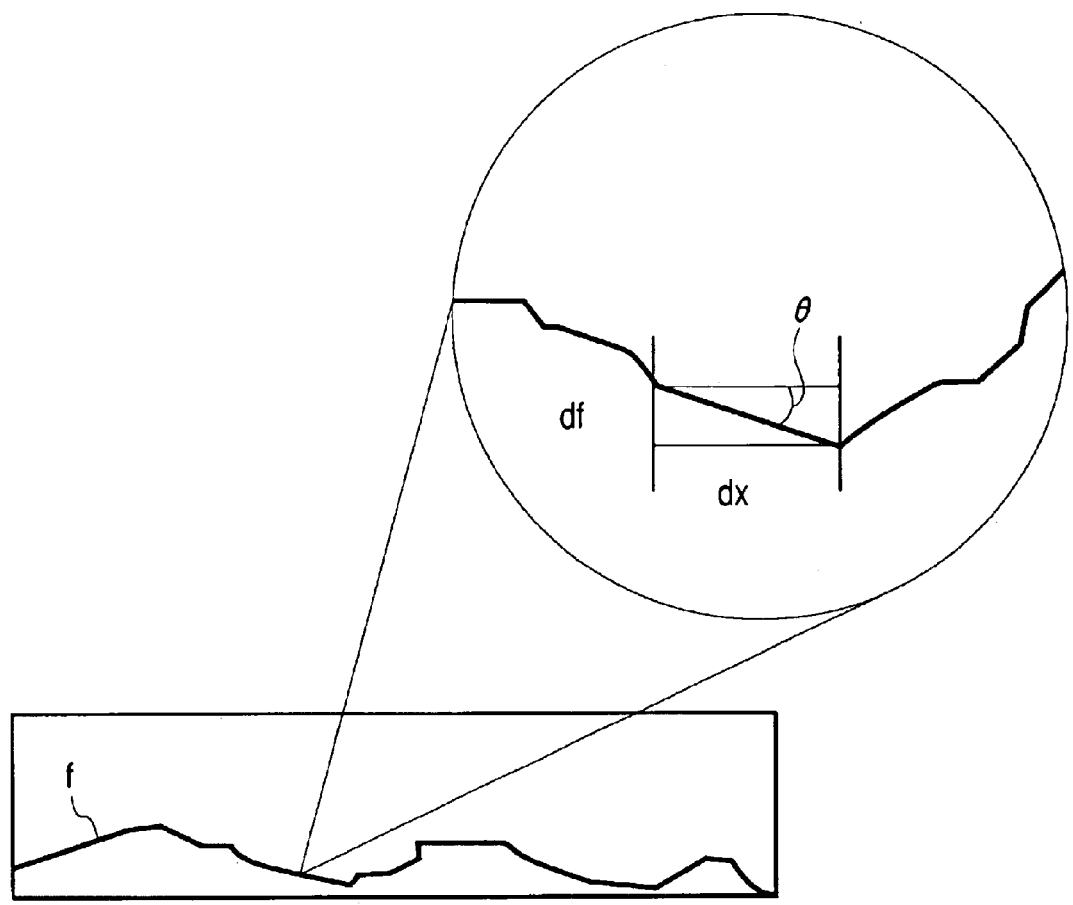
FIG. 6 is a conceptual diagram of measuring the distribution of inclinations.

FIG. 6 is a schematic diagram showing the surface of the above described shape that was observed with a probe microscope. Using the observed data, the inclination arctan (df/dx) was obtained from the slope df/dx of the cross-sectional shape f in an optional sampling length, and the distribution of the inclinations was obtained. In the range of shorter sampling lengths, slopes of unevenness not contributing to the optional confinement effect may be measured. Conversely in the range of longer sampling lengths, unevenness corresponding to wavelengths contributing to the optional confinement effect cannot be correctly evaluated because the sampling length and the pitch of the unevenness are close to each other. Consequently, the sampling length is preferable to be about ⅓ to 1/10 of the wavelength of the light intended to absorb. Generally, when the range of ultraviolet light, visible light and near-infrared light is aimed at, the sampling length is preferably 20 nm to 100 nm. In the present invention, the difference between the spacing in the direction parallel to the principal surface of the substrate and the spacing of single crystal silicon is within the range of 0.2% to 1.0% on the basis of the spacing of the single crystal silicon. If the value is less than 0.2%, it is insufficient to relax the structural unmatching, and if the value is more than 1.0%, it will become a factor of lowering the mobility of carriers because of inducing point defects within the bulk and others. This value is more preferable to be 0.3% to 0.7%. The term "spacing of single crystal silicon" used herein shall mean a general spacing of single crystal silicon, and shall not mean that the film of the present invention comprises single crystal silicon.

As a means of forming a silicon-based semiconductor film so that the difference between the spacing in the direction parallel to the principal surface of the above described substrate of a silicon-based film and the spacing of single crystal silicon is within the range of 0.2% to 1.0% relative to the spacing of the single crystal silicon with a plasma CVD method using a high frequency, the following means can be included. That is, a means in which it becomes possible to further activate ion bombardment to allow adhering silicon atoms to act as a part of the source of a driving force that promotes the displacement of the silicon atoms to the atomic positions in the early stage of the film formation, and a means in which it becomes possible to form a silicon-based film having a crystal structure corresponding to the surface shape, and others. The more active the ion bombardment is, the higher the above described value becomes.

Moreover, an etching effect acts on the surface layer to clean the surface by making the ion bombardment more active in the early stage of the film formation and as a result, the adhesion between the underlying layer (the layer on which a silicon-based film of the present invention is formed) and the silicon-based film is increased. In addition, in the early stage of the film formation on the surface layer (the underlying layer) having the above described cross-sectional shape f of the surface, it is feared that an initial film of low quality that adversely affects the mobility of a carrier may be formed. This initial film of low quality may be formed because some local areas where temperatures are not sufficient are produced, the amorphization of the film is induced by the extreme lowering of surface diffusion, and the optimization of H amount arid the relaxation of structure are insufficient. However, it is possible to retard the formation of such an initial film of low quality because a heating effect based on the kinetic energy of ions is activated by making the ion bombardment more active.

Here, with regard to the above described surface layer, in cases where an i-type semiconductor layer in a photovoltaic element comprises the above described silicon-based film, when an nip constitution is taken from the substrate side, an n-type semiconductor layer or another form of an i-type semiconductor layer is suited. When a pin constitution is taken from the substrate side, a p-type semiconductor layer or another form of an i-type semiconductor layer is suited. The shape of the above described surface layer is preferable to be formed according to the shape of the substrate surface.

As a method of forming a silicon-based film, which method makes the ion bombardment more active with the use of the plasma CVD method using a high frequency, there can be mentioned various methods, including a method in which a high frequency power to be charged is increased, a method in which a high-frequencypower supply for frequency in which active species in plasma can follow is used, a method in which inert gases like He, Ar, Ne and others, which are easily converted into a plasma, are introduced. The use of these prescriptions in the early stage of forming the above described silicon-based film makes it possible to form the film so that the difference between the spacing in the direction parallel to the principal surface of the substrate for the silicon-based film and the spacing of single crystal silicon is within the range of 0.2% to 1.0% on the basis of the spacing of the single crystal silicon.

Next, the components of a photovoltaic element of the present invention will be described.

FIG. 1 is a schematic sectional view showing one example of a photovoltaic element of the present invention. In the figure, 101 is a substrate, 102 is a semiconductor layer, 103 is a second transparent conductive layer, and 104 is a collecting electrode. Further, 101-1 is a support, 101-2 is a metal layer, 101-3 is a first transparent conductive layer, and these are constituent members of the substrate 101.

(Support)

As the support 101-1, a plate member or a sheet member that is comprised of metal, resin, glass, ceramics, semiconductor bulk or the like is suitably used. The support may have minute unevenness on its surface. Such a constitution may be adopted in which a transparent support is used and a light is incident from the support side. In such a case, light transmittability may be provided by removing the metal layer 101-2 or by forming the metal layer in a very small thickness. Further, when the support is made in a long size, continuous film formation is also made possible using the roll-to-roll method. In particular, materials having flexibility such as stainless steel, polyimide and others are suitable as the material of the support 101-1.

(Metal Layer)

The metal layer 101-2 has a role as an electrode and a role as a reflection layer by which a light reaching the support 101-1 is reflected and reused in the semiconductor layer 102. As the material, Al, Cu, Ag, Au, CuMg, AlSi and the like can be suitably used. As the forming method, a vapor deposition method, a sputtering method, an electrodeposition method, a printing method and others are suitable. The metal layer 101-2 preferably has an unevenness on its surface, by which the optical path length of the reflected light within the semiconductor layer 102 can be extended and the short circuit current can be increased. When the support 101-1 has electric conductivity, the metal layer 101-2 is not needed to be formed.

(First Transparent Conductive Layer)

The first transparent conductive layer 101-3 has a role of increasing the diffused reflection of an incident light and a reflected light to extend the optical path length within the semiconductor layer 102. Further, an element in the metal layer 101-2 has a role of diffusing or migrating into semiconductor layer 102 to prevent a photovoltaic element from shunting. This element also has a role of preventing the short circuit due to defects of pinholes in the semiconductor layer and others by providing a moderate resistance. Moreover, it is desirable that the first transparent conductive layer 101-3 has an unevenness on the surface similar to the metal layer 101-2. The first transparent conductive layer 101-3 is preferably comprised of a conductive oxide such as ZnO or ITO, and is preferably formed using a vapor deposition method, a sputtering method, a CVD method, an electrodeposition method, or the like. A substance that will change the conductivity may be added in the conductive oxide. When the metal layer 101-2 is not prepared, the first transparent conductive layer 101-3 will also serve as an electrode.

(Substrate)

According to the above described method, the metal layer 101-2 and the first transparent conductive layer 101-3 are stacked on the support 101-1 optionally to form the substrate 101. An insulating layer may be prepared as an intermediate layer within the substrate 101 to make the accumulation of the elements easy. Now, concerning a substrate in the present invention, the metal layer 101-2 and the transparent conductive layer 101-3 are not indispensable, and the support 101-1 itself may form the substrate 101. Besides, the term "substrate" is conveniently used herein, and the substrate is not needed to be plate-shaped so long as it has a prescribed surface shape. Moreover, a member having a semiconductor layer formed on a substrate may also be referred to as a "substrate".

(Semiconductor Layer)

As a major material for the silicon-based film and the semiconductor layer 102 of the present invention, Si in an amorphous phase, a crystal phase, or further a mixed phase of these is suitably used. Instead of Si, an alloy of Si and C, Ge or the like may be used. It is preferable for the semiconductor layer 102 to additionally contain hydrogen and/or halogen atoms. The preferred content is 0.1 to 40 atomic %. Furthermore, the semiconductor layer 102 may contain oxygen, nitrogen and the like. If a semiconductor layer is to be a p-type semiconductor layer, an element of Group m of the periodic table is preferably contained, and to be an n-type semiconductor layer, an element of Group V is preferably contained.

As the electrical characteristics of the p-type layer and n-type layer, the activation energy is preferably 0.2 eV or less, and optimally, 0.1 eV or less. Further, the resistivity is preferably 100 Ωcm or less, and optimally 1 Ωcm or less. In the case of a stack cell (a photovoltaic element having a plurality of pin junctions), it is preferable that an i-type semiconductor layer of a pin junction near the light incidence side has a wide bandgap and the bandgap becomes narrower with an increase of the distance of a pin junction from the light incidence side.

Further, the minimum value of the bandgap of an i-type layer is preferably near a p-layer with regard to a center in the film thickness direction within the i layer. The doping layer (a p-type layer or an n-type layer) on the light incidence side is suitably a crystalline semiconductor with a low light absorption or a semiconductor having a wide bandgap. As examples of a stack cell in which 2 pin junctions are stacked, a combination of an amorphous semiconductor layer and a semiconductor layer comprising a crystal phase in the order from the light incidence side, and a combination of a semiconductor layer comprising a crystal phase and a semiconductor layer comprising a crystal phase in the order from the light-incidence side can be included as combinations having an i-type silicon-based semiconductor layer.

Moreover, as examples of photovoltaic elements in which 3 pin junctions are stacked, combinations of (an amorphous semiconductor layer, an amorphous semiconductor layer and a semiconductor layer comprising a crystal phase), (an amorphous semiconductor layer, a semiconductor layer comprising a crystal phase and a semiconductor layer comprising a crystal phase) and (a semiconductor layer comprising a crystal phase, a semiconductor layer comprising a crystal phase and a semiconductor layer comprising a crystal phase) each in the order from the light incidence side can be included as combinations having an i-type silicon-based semiconductor layer.

As an i-type semiconductor layer, it is preferable that the absorption coefficient ($\alpha$) of light (630 nm) is 500 cm$^{-1}$ or more, the photoconductivity (σp) under irradiation with artificial sunlight by a solar simulator (AM 1.5; 100 mW/cm$^2$) is 10×10$^{-5}$ S/cm or more, the dark conductivity (σd) is 10×10$^{-6}$ S/cm or less, and the Urbach energy measured by a constant photocurrent method (CPM) is 55 meV or less. As an i-type semiconductor layer, a slightly p-type one and a slightly n-type one can also be used. Further, the pin junction may be a constitution in the order of a p-layer, an i-layer and an n-layer from the substrate side, or that in the reverse order.

(Method of Forming Semiconductor Layer)

In order to form a silicon-based film and the described semiconductor layer 102 of the present invention, a high-frequency plasma CVD method is suitable. A suitable procedure for forming semiconductor layer 102 according to a high-frequency plasma CVD method is as follows:

(1) The pressure inside a pressure-reducible deposition chamber (a vacuum chamber) is reduced to a prescribed deposition pressure.

(2) Material gases, including a source gas and a diluting gas, are introduced into the deposition chamber, and the pressure inside the deposition chamber is set to a prescribed pressure while continuing the exhaust-from the deposition chamber with a vacuum pump.

(3) The substrate 101 is set to a prescribed temperature with a heater.

(4) A high frequency oscillated by a high frequency power supply is introduced into the above described deposition chamber. The introduction methods into the above described deposition chamber include a method in which a high frequency is conducted by a waveguide and introduced into the deposition chamber through a dielectric window of alumina ceramics and the like, and a method in which a high frequency is conducted by a coaxial cable and introduced into the deposition chamber through a metal electrode.

(5) A plasma is generated in the deposition chamber to decompose the source gas and a deposition film is formed on the substrate 101 arranged within the deposition chamber. The semiconductor layer 102 is formed by repeating this procedure a plurality of times, if necessary.

As the conditions of forming the silicon-based film and the above described semiconductor layer 102 of the present invention, the substrate temperature of 100 to 450° C., the pressure of 0.5 mTorr to 10 Torr, the high frequency power of 0.001 to 1 W/cm$^3$ within the deposition chamber are suitable conditions.

As the source gases that are suitable for forming the silicon-based film and the above described semiconductor layer 102 of the present invention, vaporizable compounds containing silicon atom, including $SiH_4$, $Si_2H_6$ and $SiF_4$, can be included. When an alloy-based film and/or an alloy-based semiconductor layer is formed, it is desirable to add a vaporizable compound containing Ge or C, including $GeH_4$ and $CH_4$, into a feed gas. It is desirable to dilute a source gas with a diluting gas and introduce the diluted source gas into the deposition chamber. As the diluting gas, $H_2$, He, Ar, Ne and the like can be listed. Further, a vaporizable compound containing nitrogen, oxygen and the like may be added as a source gas or a diluting gas. In order that a Raman scattering strength resulting from an amorphous component not exceed a Raman scattering strength resulting from a crystalline component, there can be included some methods, including a method of raising the flow rate ratio of $H_2$ gas to $SiH_4$ gas, a method of raising temperature for film formation, and a method of using a gas containing an element of halogens like $SiF_4$ and others as a source gas.

As the dopant gas to make the semiconductor layer be a p-type layer, $B_2H_6$, $BF_3$ and the like are used. Further, as the dopant gas to make the semiconductor layer be an n-type layer, $PH_3$, $PF_3$ and the like are used.

When a film of a crystal phase, and a layer of SiC and the like with low light absorption or having a wide bandgap are deposited, it is preferable to increase the ratio of a diluting gas to a source gas and to introduce a high frequency with a relatively high power. Further, in order to form a silicon-based film of the present invention so that the difference between the spacing in the direction parallel to the above described substrate and the spacing of single crystal silicon is within the range of 0.2% to 1.0% on the basis of the spacing of single crystal silicon, it is considered that, as described above, it is possible to further activate ion bombardment to allow adhering silicon atoms to act as a part of the source of a driving force that promotes the displacement of the silicon atoms to the atomic positions in the early stage of the film formation. It is made possible to form a silicon-based film having a crystal structure corresponding to the surface shape. As a method of forming a silicon-based film, which method makes ion bombardments more active with the use of the plasma CVD method using a high frequency, there can be included various methods, including a method in which a high frequency power to be charged is increased, a method in which a high-frequency power supply for frequency in which active species in a plasma can follow is used, a method in which an inert gas like He, Ar, Ne and others, which is easily converted to a plasma, is introduced. The high frequency in the plasma CVD method is preferably 10 MHz or more to 10 GHz or less. Further, in the above described range and in the initial area of film forming, it is preferable to form a film using a relatively low frequency so that active species in plasma can easily follow.

(Second Transparent Conductive Layer)

In an example shown in FIG. 1, the second transparent conductive layer 103 can reserve the role of an antireflection film by properly setting the film thickness, as well as being an electrode in the light incidence side. The second transparent conductive layer 103 is needed to have a high transmittance in a wavelength area that semiconductor layer 102 can absorb and to be low in resistivity. It is preferable that the transmittance at 550 nm is 80% or more, and more preferably, 85% or more. It is preferable that the resistivity is 5×10$^{-3}$ Ωcm or less, and more preferably, 1×10$^{-3}$ Ωcm or less. As the material for the second transparent conductive layer 103, ITO, ZnO, $In_2O_3$ and others can be suitably used. As the methods of forming the layer, methods of vapor deposition, CVD, spraying, spin-on, dipping and others are suitable. A substance for changing conductivity may be added in these materials.

(Collecting Electrode)

The collecting electrode 104 is provided on the transparent electrode 103 to improve the current collecting efficiency. As the forming methods, a method of forming a metal of an electrode pattern by a sputtering with a mask, a method of printing a conductive paste or soldering paste, a method of firmly fixing a metal wire using a conductive paste, and others are suitable.

Moreover, a protective layer may be formed on both surfaces of a photovoltaic element if necessary. At the same time, a reinforcing material, including a steel plate, may be used together on the back of the photovoltaic element (the light incidence side and the reflection side) and the like.

EXAMPLES

In the following examples, the present invention will be concretely described with reference to a solar cell as a photovoltaic element, but these examples are not intended to limit the contents of the present invention.

Example 1

Figure 2:
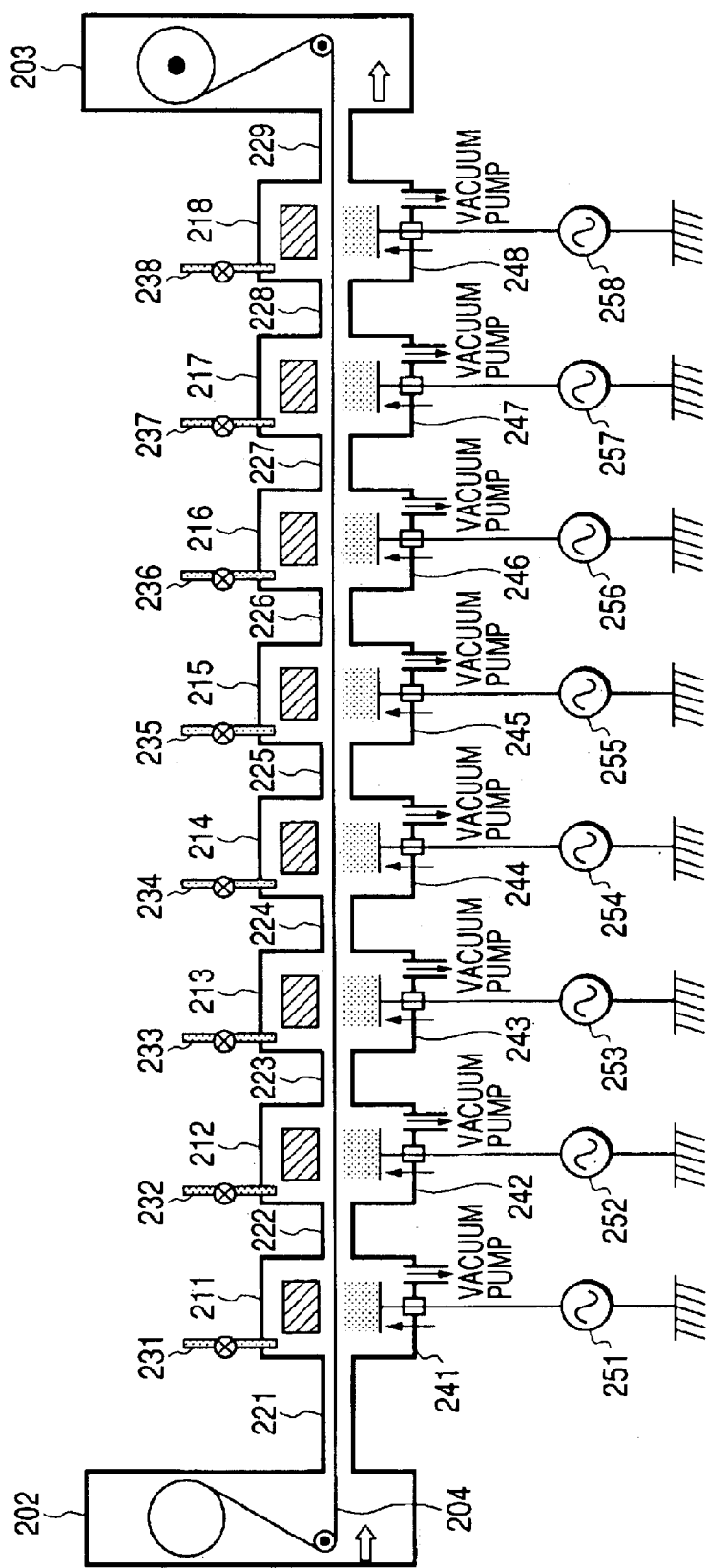
FIG. 2 is a schematic sectional view showing one example of a deposited film forming apparatus to produce a silicon-based film and a photovoltaic element of the present invention.

A silicon-based film was formed according to the following procedure using a deposited film forming apparatus 201 shown in FIG. 2.

FIG. 2 is a schematic sectional view showing one example of a deposited film forming apparatus to produce a silicon-based film and a photovoltaic element of the present invention. The deposited film forming apparatus 201 shown in FIG. 2 is constituted by combining substrate 204, a delivery container 202, vacuum containers 211 to 218 for forming a semiconductor and a substrate winding container 203 by means of gas gates 221 to 229. In this deposited film forming apparatus 201, a belt-like conductive substrate 204 is set through each container and each gas gate 221 to 229. The belt-like conductive substrate 204 is wound off from a bobbin installed in the substrate delivery container 202 and is wound up by another bobbin in the substrate winding container 203.

Vacuum containers 211 to 218 for forming a semiconductor each have a deposition chamber [each], and a glow discharge occurred by applying a high frequency electric power from high frequency power supplies 251 to 258 to the discharge electrodes 241 to 248 in the discharge chamber, by which the source gas was decomposed and a semiconductor layer was deposited on conductive substrate 204. Further, gas introduction pipes 231 to 238 for introducing the source gas and a diluting gas are connected to vacuum containers 211 to 218 for forming a semiconductor, respectively.

The deposited film forming apparatus 201 shown in FIG. 2 is provided with 8 vacuum containers for forming a semiconductor. However, in the following examples, a glow discharge is not needed to occur in all of the vacuum containers for forming a semiconductor, and it is possible to select the presence or absence of a glow discharge in each container according to the layer composition of a photovoltaic element to be produced. Further, a film forming region adjusting plate, which is not shown in the figure, is provided in each semiconductor forming device to adjust the contact area between the conductive substrate 204 and the discharge space in each deposition chamber, and the film thickness of each semiconductor film formed in each container can be adjusted by adjusting the plate.

First, a belt-like substrate (40 cm in width, 200 nm in length, and 0.125 mm in thickness) made of stainless steel (SUS430BA) was sufficiently degreased, washed, and installed in a continuous sputtering device, which is not shown in the figure, and then an Ag thin film of 100 nm in thickness was deposited by sputtering at room temperature, using an Ag electrode as a target.

In addition, using a ZnO target, a ZnO thin film of 1.2 μm in thickness was deposited on the Ag thin film by sputtering to form a belt-like conductive substrate 204. Next, the substrate 204 was installed in a wet etcher, which is not shown in the figure, and dipped in a 5% acetic acid solution for 30 seconds, and then the substrate 204 was sufficiently washed and dried. A part of the prepared conductive substrate 204 was cut off and the cross-sectional shape of the surface was observed with a probe microscope, and when the distribution of the inclinations in the cross section was found, the standard deviation was 20°.

In the next place, a bobbin on which the conductive substrate 204 had been wound was installed in the substrate delivery container 202, and the conductive substrate 204 was passed to the substrate winding container 203 through a gas gate in the carrying-in side, the vacuum containers 211, 212, 213, 214, 215, 216, 217, and 218 for forming a semiconductor, and a gas gate in the carrying-out side. Further, the tension was adjusted so that the belt-like conductive substrate 204 would not be loosened. After that, the substrate delivery container 202, the vacuum containers 211, 212, 213, 214, 215, 216, 217, and 218 for forming a semiconductor, and the substrate winding container 203 were sufficiently evacuated to $5 \times 10^{-6}$ Torr with a vacuum pumping system comprising a vacuum pump.

Next, while the vacuum pumping system was operated, a source gas and a diluting gas were provided from the introduction pipes 232, 233, and 234 to the vacuum containers 212, 213, and 214 for forming a semiconductor.

Furthermore, $H_2$ gas of 200 sccm was supplied to the vacuum containers for forming a semiconductor, except the vacuum containers 212, 213, and 214 for forming a semiconductor through the gas introduction pipes. At the same time, $H_2$ gas of 500 sccm was provided to each gas gate as a gate gas through each gate gas feed pipe, which is not shown in the figure. In this state, the pressure inside the vacuum containers 212, 213, and 214 for forming a semiconductor was adjusted to the desired pressure by adjusting the pumping performance of the vacuum pumping system. The forming conditions are as shown in Table 1.

After the pressures inside the vacuum containers 212, 213, and 214 for forming a semiconductor were stabilized, the conductive substrate 204 was started to move in the direction from the substrate delivery container 202 to the substrate winding container 203. While the conductive substrate 204 was moved, a high frequency was introduced to the discharge electrodes 242, 243, and 244 in the vacuum containers 212, 213, and 214 for forming a semiconductor from the high frequency power supplies 252, 253, and 254, and glow discharges were generated within the deposition chambers in the vacuum containers 212, 213, and 214 for forming a semiconductor to form an i-type semiconductor layer comprising a crystal phase (1.5 μm in thickness: a silicon-based film) on the conductive substrate 204 (Example 1). Here, the high-frequency electric power of 100 MHz in frequency and 20 mW/cm³ in power was introduced in the vacuum containers 212, 213, and 214 for forming a semiconductor.

Next, a silicon-based film was formed by the same method as Example 1, except that Ar was not introduced in the vacuum container 212 for forming a semiconductor in Table 1 (Comparative example 1).

When diffraction peaks were measured in silicon-based films prepared in Example 1 and Comparative example 1 by the θ-2θ method with an X-ray diffraction system and the spacing of the (220) plane was found from 2θ position in the diffraction peak of 220 reflection in each film, as compared to the spacing of the (220) plane in single crystal silicon of 1.9201 Å that was found from the X-ray difftactometry, the spacing in the silicon-based film of Example 1 was wider by 0.4%, and the spacing in the silicon-based film of Comparative example 1 was about the same value as single crystal silicon.

Moreover, the density of dangling bonds in the silicon-based films was evaluated by the electron spin resonance (ESR) method, which resulted in the density of dangling bonds in the silicon-based film prepared in Example 1 being two-thirds of the density of dangling bonds in the silicon-based film prepared in Comparative example 1. From the above results, it is seen that the silicon-based film of the present invention is characterized by a small density of dangling bonds and an excellent mobility of carriers.

Example 2

Figure 3:
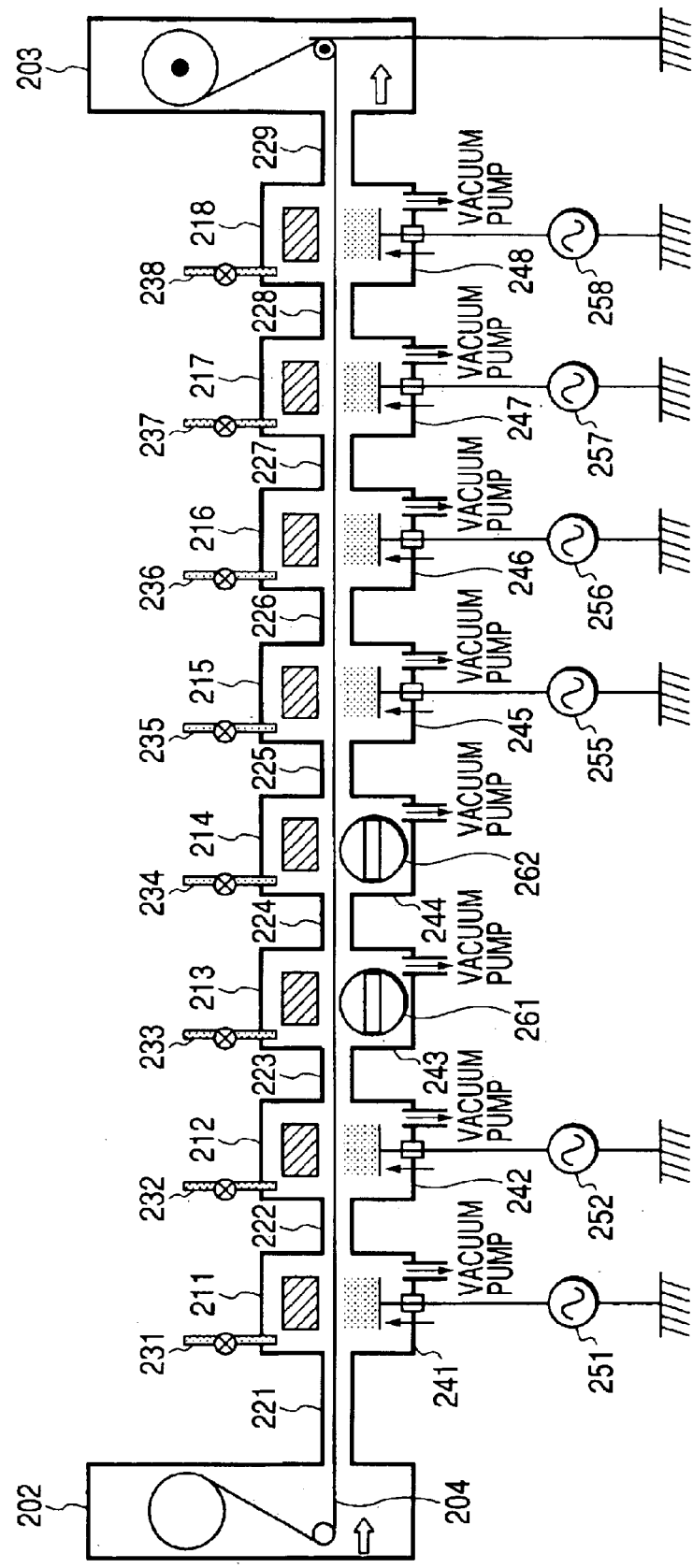
FIG. 3 is a schematic sectional view showing one example of a deposited film forming apparatus to produce a silicon-based film and a photovoltaic element of the present invention.

A silicon-based film was formed on a conductive substrate 204 similarly to Example 1 using the deposited film forming apparatus 201 shown in FIG. 3. The forming conditions are as shown in Table 2.

After the pressures inside the vacuum containers 212, 213, and 214 for forming a semiconductor were stabilized, the conductive substrate 204 was started to move in the direction from the substrate delivery container 202 to the substrate winding container 203. While the conductive substrate 204 was moved, a high frequency was introduced to discharge electrodes 242, 243, and 244 in the vacuum containers 212, 213, and 214 for forming a semiconductor from the high frequency power supplies 252, 253, and 254, and glow discharges were generated within the deposition chambers in the vacuum containers 212, 213, and 214 for forming a semiconductor to form an i-type semiconductor layer comprising a crystal phase (1.5 μm in thickness: a silicon-based film) on the conductive substrate 204 (Example 2).

Here, the high-frequency electric power of 13.56 MHz in frequency and 30 mW/cm$^3$ in power was introduced in the vacuum container 212 for forming a semiconductor, and the high-frequency electric power of 2.45 GHz in frequency and 50 mW/cm$^3$ in power was introduced in the vacuum containers 213 and 214 for forming a semiconductor through microwave applicators 261 and 262.

In the next place, when a diffraction peak was measured in the silicon-based film prepared in Example 2 by the θ–2θ method with an X-ray diffraction system and the spacing of the (220) plane was found from 2θ position in the diffraction peak of 220 reflection, as compared to the spacing of the (220) plane in single crystal silicon of 1.9201 Å that was found from the X-ray diffractometry, the spacing in the silicon-based film of Example 2 was 0.78% wider.

Moreover the density of dangling bonds in the silicon-based film was evaluated by the electron spin resonance (ESR) method, resulting in the density of dangling bonds in the silicon-based film prepared in Example 2 being three-fifths of the density of dangling bonds in the silicon-based film prepared in Comparative example 1. From the above results, it is known that a silicon-based film of the present invention is low in density of dangling bonds and has an excellent property in the mobility of a carrier.

Example 3

Figure 4:
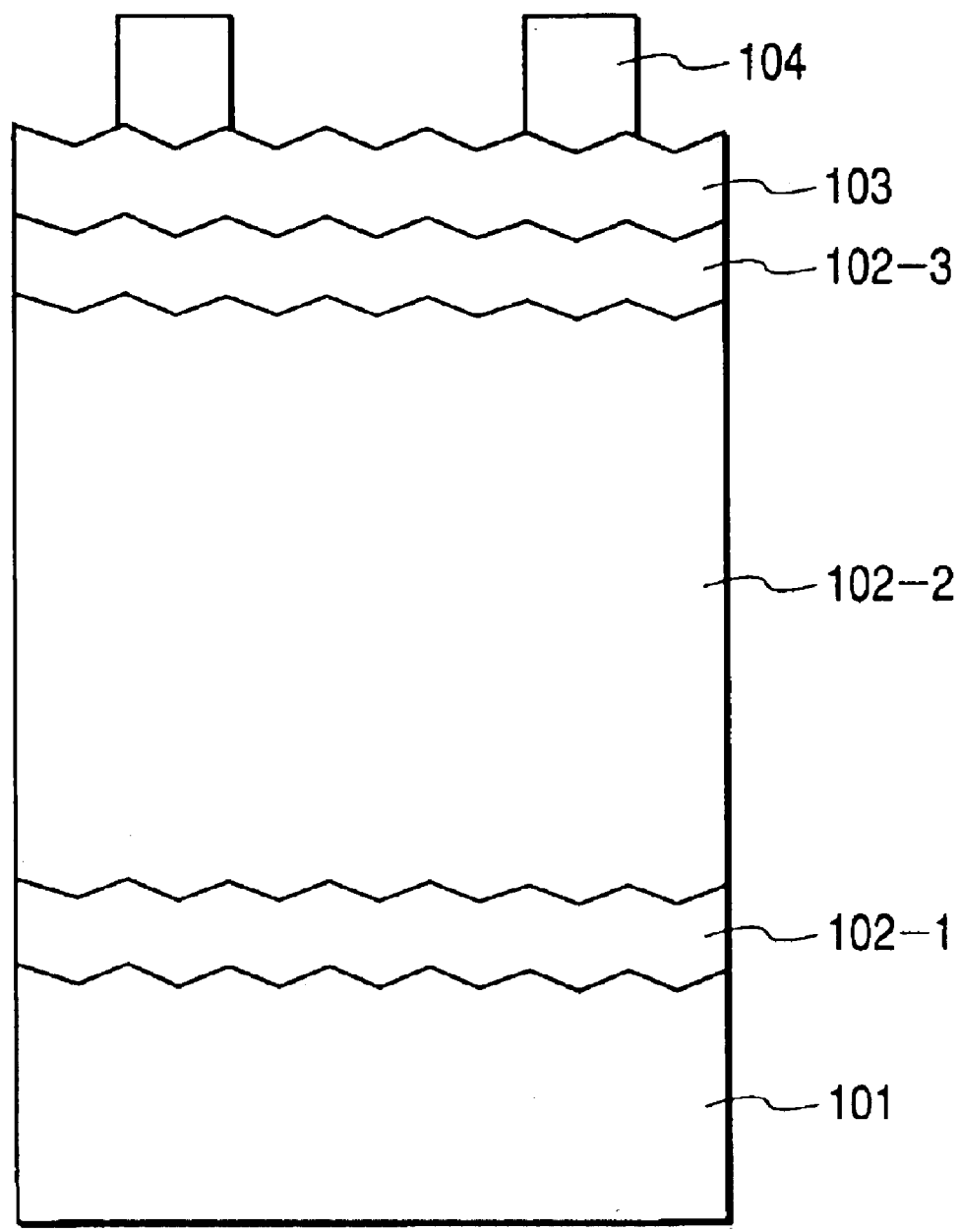
FIG. 4 is a schematic sectional view showing one example of a photovoltaic element comprising a silicon-based film of the present invention.

A pin-type photovoltaic element shown in FIG. 4 was formed according to the following procedure using the deposited film forming apparatus 201 shown in FIG. 2. FIG. 4 is a schematic sectional view showing one example of a photovoltaic element comprising a silicon-based film of the present invention. In the figure, the same members as those in FIG. 1 will be marked with the same symbols and their description will be omitted. The semiconductor layer of this photovoltaic element is comprised of an amorphous n-type semiconductor layer 102-1, an i-type semiconductor layer 102-2 composing microcrystals, and a microcrystalline p-type semiconductor layer 102-3. That is, this photovoltaic element is a so-called pin-type single cell photovoltaic element.

Similarly to Example 1, a belt-like conductive substrate 204 was prepared and installed in the deposited film forming apparatus 201, and the substrate delivery container 202, the vacuum containers 211, 212, 213, 214, 215, 216, 217, and 218 for forming a semiconductor, and the substrate winding container 203 were sufficiently evacuated to 5×10$^{-6}$ Torr or less with a vacuum pumping system comprising a vacuum pump not shown in the figure.

Next, while the vacuum pumping system was operated, a source gas and a diluting gas were provided from the gas introduction pipes 231 to 235 to the vacuum containers 211 to 215 for forming a semiconductor.

Furthermore, H$_2$ gas of 200 sccm was supplied to the vacuum containers for forming a semiconductor except the vacuum containers 211 to 215 for forming a semiconductor through the gas introduction pipes. At the same time, H$_2$ gas of 500 sccm was provided to each gas gate as a gate gas through each gate gas feed pipe, which is not shown in the figure. At this condition, the pressures inside the vacuum containers 211 to 215 for forming a semiconductor were adjusted to the desired pressures by adjusting the pumping performance of the vacuum pumping system. The forming conditions are as shown in Table 3.

Next, through the introduction of a high frequency into the discharge electrodes 241 to 245 within the vacuum containers 211 to 215 for forming a semiconductor from high frequency power supplies 251 to 255, glow discharges were generated within deposition chambers in the vacuum containers 211 to 215 for forming a semiconductor. An amorphous n-type semiconductor layer (30 nm in film thickness), an i-type semiconductor layer comprising a crystal phase (1.5 μm in film thickness) and a microcrystalline p-type semiconductor layer (10 nm in film thickness) were formed on the conductive substrate 204, resulting in the formation of a photovoltaic element.

Here, the high frequency electric power of 13.56 MHz in frequency and 50 mW/cm$^3$ in power was introduced in the vacuum container 211 for forming a semiconductor, the electric power of 100 MHz in frequency and 20 mW/cm$^3$ in power was in the vacuum containers 212, 213 and 214 for forming a semiconductor, and the electric power of 13.56 MHz in frequency and 30 mW/cm$^3$ in power was in the container 215 for forming a semiconductor. Next, using a continuous modularizing apparatus not shown in the figure, the formed belt-like photovoltaic element was processed to be a solar cell module of 36 cm×22 cm in size (Example 3).

Next, a solar cell module was formed by the same method as Example 3, except that Ar was not introduced in the vacuum container 212 for forming a semiconductor (Comparative example 3).

The photoelectric conversion efficiencies of the solar cell modules prepared in Example 3 and Comparative example 3 were measured using a solar simulator (AM 1.5, 100 mW/cm$^2$). When the photoelectric conversion efficiency of the solar cell module formed in Example 3 was standardized (normalized) to be 1, the value of the photoelectric conversion efficiency of the solar cell module formed in Comparative example 3 was 0.90.

Further, the adhesion between the conductive substrate and the semiconductor layer was examined with the use of the cross cut tape test method (the gap width of cut is 1 mm, the number of squares is 100). Further, a solar cell module of which the initial photoelectric conversion efficiency had been measured in advance was put in a dark place, where the temperature was 85° C. and the humidity was 85%, and kept for 30 minutes, then the temperature was lowered to −20° C. in 70 minutes and the module was kept at that temperature for 30 minutes, and then the temperature was again returned to 85° C. and humidity to 85% in 70 minutes. After this cycle was repeated 100 times, the photoelectric conversion efficiency was measured again, and the variation of the photoelectric conversion efficiency as a result of the temperature and humidity test was examined.

Furthermore, after a solar cell module of which the initial photoelectric conversion efficiency had been measured in advance was kept at 50° C. and irradiated with an artificial sunlight (AM 1.5, 100 mW/cm³) for 500 hours, the photoelectric conversion efficiency was measured again, and the variation of the photoelectric conversion efficiency as a result of the photodegradation test was examined. These results are shown in Table 4.

As shown in Table 4, the solar cell module of Example 3, which comprises a photovoltaic element of the present invention, is excellent in the initial conversion efficiency, the adhesion, and the durability in the temperature and humidity test and the photodegradation test, when compared to the solar cell module of Comparative example 3. From the above results, it is seen that a solar cell module comprising a photovoltaic element of the present invention has excellent properties.

Example 4

First, similarly to Example 1, a belt-like substrate (40 cm in width, 200 m in length, and 0.125 mm in thickness) made of stainless steel (SUS430BA) was sufficiently degreased, washed, and installed in a continuous sputtering apparatus, which is not shown in the figure, and then an Ag thin film of 100 nm in thickness was deposited by sputtering at room temperature, using Ag electrode as a target. In addition, using a ZnO target, a ZnO thin film of 1.2 μm in thickness was deposited on the Ag thin film by sputtering to form belt-like conductive substrate 204. Next, the conductive substrate 204 was installed in a wet etcher, which is not shown in the figure, and was wet etched in 5% acetic acid solution so that the standard deviation of inclinations in the cross section became to be 15 °, 20°, 25°, 40°, 50°, and 55° while changing time. Then, the wet etched substrate 204 was sufficiently washed and dried. After that, a pin-type photovoltaic element was formed similarly to Example 3, using deposited film forming apparatus 201 shown in FIG. 2 (Example 4-1 to 4-6).

After wet etching was carried out in the same way so that the standard deviation of inclinations in the cross section became 5° and 60° while changing time, the substrate was sufficiently washed and dried. After that, a pin-type photovoltaic element was made similarly to Example 3 using the deposited film forming apparatus 201 shown in FIG. 2 (Comparative example 4-1 and 4-2).

Figure 7:
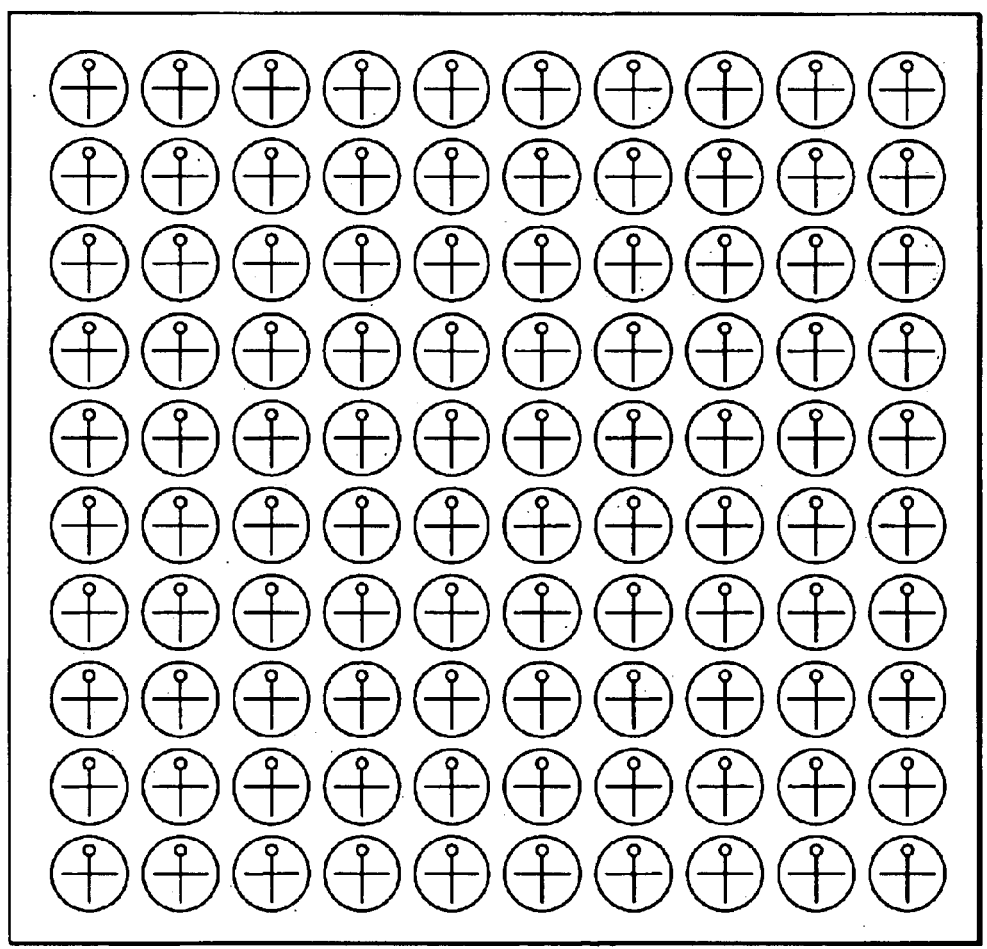
FIG. 7 is a schematic view of subcells.

A hundred pieces of transparent conductive layers (ITO) 103 in total were prepared in the circular shape having 1 cm² area on a semiconductor layer by masking as shown in FIG. 7 and served as subcells, and a collecting electrode was prepared on each subcell. The solar cell characteristics of these subcells were measured with a solar simulator (AM 1.5; 100 mW/cm²; 25° C. in surface temperature), and the shunt resistances of 100 pieces of subcells of each solar cell was measured. A subcell having a practically needed shunt resistance was judged to be a surviving subcell, the yield was evaluated based on the number of surviving subcells, and the yield of each photovoltaic element was compared. When the number of surviving subcells in Example 4-1 was standardized to be 1, the number of surviving cells in each photovoltaic element is shown in Table 5.

Further, the average value of the photoelectric conversion efficiency values of the surviving subcells in each photovoltaic element was calculated. When the photoelectric conversion efficiency of the solar cell module in Example 4-1 was standardized to be 1, the photoelectric conversion efficiency of each photovoltaic element is shown in Table 5.

As shown in Table 5, the average value of the photoelectric conversion efficiency was low in Comparative example 4-1. Because the short circuit current in Comparative example 4-1 was 0.85 when the short circuit current in Example 4-1 was standardized to be 1, the lowered part of the photoelectric conversion efficiency is considered to be caused by the decrease in the short circuit current due to insufficient optical confinement effect. Further, the number of surviving subcells was small in Comparative example 4-2. The reason for this low number of surviving cells is considered to be that a steep peak was generated in the surface of the conductive substrate, which generates local stress within the silicon-based film.

From the above results, it is seen that a photovoltaic element of the present invention has excellent properties.

Example 5

Figure 5:
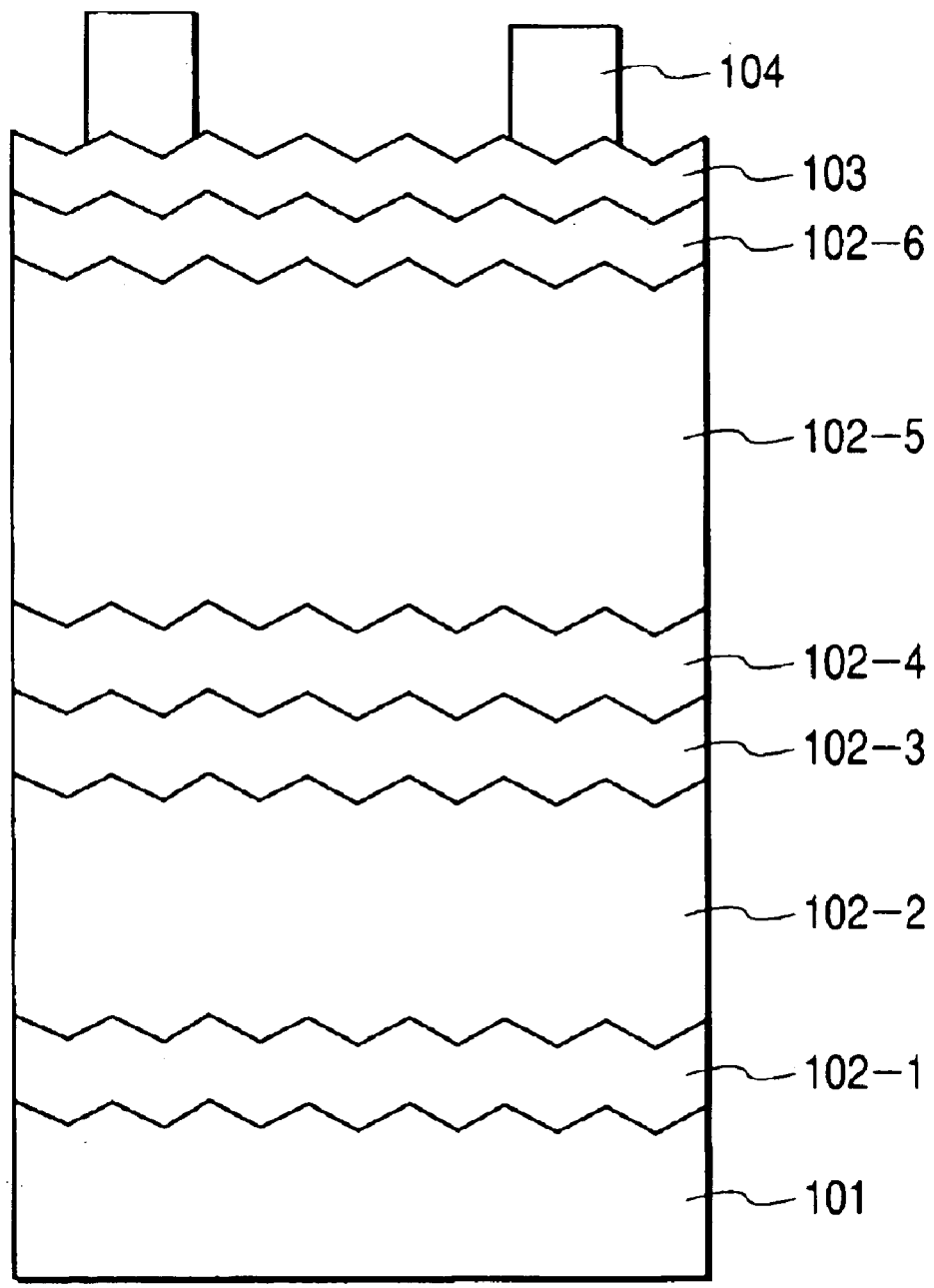
FIG. 5 is a schematic sectional view showing one example of a photovoltaic element comprising a silicon-based film of the present invention.

A photovoltaic element shown in FIG. 5 was formed according to the following procedure using the deposited film forming apparatus 201 shown in FIG. 2. FIG. 5 is a schematic sectional view showing one example of a photovoltaic element comprising a silicon-based film of the present invention. In the figure, the same members as those in FIG. 1 will be marked with the same symbols and their description will be omitted. The semiconductor layer of this photovoltaic element is comprised of an amorphous n-type semiconductor layer 102-1, an i-type semiconductor layer 102-2 comprising microcrystals, a microcrystalline p-type semiconductor layer 102-3, an amorphous n-type semiconductor layer 102-4, an amorphous i-type semiconductor layer 102-5, and a microcrystalline p-type semiconductor layer 102-6. That is, this photovoltaic element is a so-called pin-type double cell photovoltaic element.

Similarly to Example 3, a belt-like conductive substrate 204 was prepared and installed in the deposited film forming apparatus 201, and the substrate delivery container 202, the vacuum containers 211, 212, 213, 214, 215, 216, 217, and 218 for forming a semiconductor, and the substrate winding container 203 were sufficiently evacuated to 5×10⁻⁶ Torr or less with a vacuum pumping system comprising a vacuum pump not shown in the figure.

Next, while the vacuum pumping system was operated, a source gas and a diluting gas were supplied from the gas introduction pipes 231 to 238 to the vacuum containers 211 to 218 for forming a semiconductor.

Furthermore, $H_2$ gas of 500 sccm was supplied to each gas gate as a gate gas through each gate gas feed pipe, which is not shown in the figure. In this state, the pressures inside the vacuum containers 211 to 218 for forming a semiconductor were adjusted to the desired pressures by adjusting the pumping performance of the vacuum pumping system. The formation of the bottom cell was carried out similarly to Example 3, the formation of the n layer and the p layer in the top cell was carried out similarly to Example 3, and the formation of the i-type semiconductor layer in the top cell was carried out in such conditions that $SiH_4$ is 50 sccm, $H_2$ is 500 sccm, the substrate temperature is 220° C., and the pressure is 1.2 Torr.

After the pressures within the vacuum containers 211 to 218 for forming a semiconductor were stabilized, the conductive substrate 204 was started to move in the direction from the substrate delivery container 202 to the substrate winding container 203.

Next, through the introduction of high-frequency in discharge electrodes 241 to 248 within the vacuum containers 211 to 218 for forming a semiconductor from high-frequency power supplies 251 to 258, glow discharges were generated within deposition chambers in the vacuum containers 211 to 218 for forming a semiconductor and an amorphous n-type semiconductor layer (30 nm in film thickness), an i-type semiconductor layer comprising a crystal phase (2.0 μm in film thickness) and a microcrystalline p-type semiconductor layer (10 nm in film thickness) were formed on the conductive substrate 204, resulting in the preparation of the bottom cell, on which cell further an amorphous n-type semiconductor layer (30 nm in film thickness), amorphous i-type semiconductor layer (0.3 μm in film thickness) and a microcrystalline p-type semiconductor layer (10 nm in film thickness) were formed, resulting in the preparation of the top cell, and as a result, a photovoltaic element was formed.

Here, the high frequency electric power of 13.56 MHz in frequency and 5 mW/cm$^3$ in power was introduced in the vacuum container 211 for forming a semiconductor, the electric power of 100 MHz in frequency and 20 mW/cm$^3$ in power was in the vacuum containers 212, 213 and 214 for forming a semiconductor, the electric power of 13.56 MHz in frequency and 30 mW/cm$^3$ in power was in the container 215 for forming a semiconductor, the electric power of 13.56 MHz in frequency and 5 mW/cm$^3$ in power was in the vacuum containers 216 and 217 for forming a semiconductor, and the high-frequency electric power of 13.56 MHz in frequency and 30 mW/cm$^3$ in power was introduced in the vacuum container 218 for forming a semiconductor.

Next, using a continuous modularizing apparatus not shown in the figure, the formed belt-like photovoltaic element was processed to be a solar cell module of 36 cm×22 cm in size (Example 5).

The solar cell module of Example 5 showed 1.2 times higher photoelectric conversion efficiency when compared to the solar cell module of Example 3, and the solar cell module of Example 5 is excellent in adhesion and in durability in the temperature and humidity test and the photodegradation test. From the above results, it is seen that a solar cell module comprising a photovoltaic element of the present invention has excellent properties.

Example 6

Solar cell modules were formed by the same method as Example 3 and Comparative example 3, except for high frequency power to be introduced in the vacuum container 212 for forming a semiconductor was changed (Example 6-1 to 6-5, and Comparative example 6-1 to 6-2). The spacing of the (220) plane in the i-type semiconductor layer of each solar cell module was found to be wider in the range of 0.1% to 1.5%, as compared to the spacing in single crystal silicon that was found from the X-ray diffractometry.

The photoelectric conversion efficiencies of the solar cell modules prepared in Example 6 and Comparative example 6 were measured using a solar simulator (AM 1.5, 100 mW/cm$^2$).

Further, the adhesion between the conductive substrate and the semiconductor layer was examined with the use of the cross cut tape test method (the gap width of cut is 1 mm, the number of squares is 100). Further, a solar cell module of which the initial photoelectric conversion efficiency had been measured in advance was put in a dark place, where the temperature was 85°C. and the humidity was 85%, and kept for 30 minutes, then the temperature was lowered to −20° C. in 70 minutes and the module was kept at that temperature for 30 minutes, and then the temperature was again returned to 85° C. and humidity to 85% in 70 minutes. After this cycle was repeated 100 times, the photoelectric conversion efficiency was measured again and the variation of the photoelectric conversion efficiency as a result of the temperature and humidity test was examined.

Furthermore, after a solar cell module of which the initial photoelectric conversion efficiency had been measured in advance was kept at 50° C. and irradiated with an artificial sunlight (AM 1.5, 100 mW/cm$^2$) for 500 hours, the photoelectric conversion efficiency was measured again and the variation of the photoelectric conversion efficiency as a result of the photodegradation test was examined. These results are shown in Table 6.

The numeral values in the column of the spacing of the (220) plane indicate expanded rates as compared to the spacing of the surface in single crystal silicon that was found from the X-ray diffractometry.

As shown in Table 6, the solar cell modules in which the spacing of the (220) plane in the i-type semiconductor layer was found to be wider in the range of 0.2% to 1.0% as compared to the spacing in single crystal silicon that was found from the X-ray diffractometry are excellent in the initial conversion efficiency, the adhesion, and the durability in the temperature and humidity test and the photodegradation test, when compared to the solar cell modules of Comparative example 6. From the above results, it is seen that a solar cell module comprising a photovoltaic element of the present invention has excellent properties.

As described above, the preferred embodiments of the present invention makes it possible to provide a silicon-based film that is excellent in the mobility of carriers even on the surface. A photovoltaic element comprising the silicon-based film improves in adhesion with a substrate and shows good environmental resistance because good photoelectric conversion characteristics are obtained, crack generating factors in the film are suppressed, and the formed surface is cleaned.

TABLE 1

| Formation conditions of 212 | Source gases | SiH$_4$: 30 sccm H$_2$: 1000 sccm Ar: 100 sccm |
|---|---|---|
| | Substrate temperature | 300° C. |
| | Pressure | 300 mTorr |
| Formation conditions of 213 and 214 | Source gases | SiH$_4$: 30 sccm H$_2$: 1000 sccm |
| | Substrate temperature | 300° C. |
| | Pressure | 300 mTorr |

TABLE 2

| Formation conditions of 212 | Source gases | SiH$_4$: 30 sccm H$_2$: 1000 sccm |
|---|---|---|
| | Substrate temperature | 200° C. |
| | Pressure | 300 mTorr |
| Formation conditions of 213 and 214 | Source gases | SiH$_4$: 30 sccm H$_2$: 1000 sccm |
| | Substrate temperature | 300° C. |
| | Pressure | 300 mTorr |

TABLE 3

| Formation conditions of 211 | Source gases | SiH$_4$: 20 sccm<br>H$_2$: 100 sccm<br>PH$_3$ (diluted with H$_2$ to 2%): 30 sccm |
| --- | --- | --- |
| | Substrate temperature | 300° C. |
| | Pressure | 1.0 Torr |
| Formation conditions of 212 | Source gases | SiH$_4$: 30 sccm<br>H$_2$: 1000 sccm<br>Ar: 100 sccm |
| | Substrate temperature | 300° C. |
| | Pressure | 300 mTorr |
| Formation conditions of 213 and 214 | Source gases | SiH$_4$: 30 sccm<br>H$_2$: 1000 sccm |
| | Substrate temperature | 300° C. |
| | Pressure | 300 mTorr |
| Formation conditions of 215 | Source gases | SiH$_4$: 10 sccm<br>H$_2$: 800 sccm<br>BF$_3$ (diluted with H$_2$ to 2%): 100 sccm |
| | Substrate temperature | 200° C. |
| | Pressure | 1.2 Torr |

TABLE 4

| | Example 3 | Comparative Example 3 |
| --- | --- | --- |
| Initial photoelectric conversion efficiency | 1 | 0.90 |
| Number of surviving squares in cross cut tape test (normalized with the value for Example 3 being 1) | 1 | 0.95 |
| Variation of photoelectric conversion efficiency in temperature-humidity test (efficiency after test/initial efficiency) | 1.0 | 0.95 |
| Variation of photoelectric conversion efficiency in photodegradation test (normalized with the value for Example 3 being 1) | 1 | 1.35 |

TABLE 5

| Standard deviation of cross sectional inclination | 5°<br>Comp. Ex. 4-1 | 15°<br>Ex. 4-1 | 20°<br>Ex. 4-2 | 25°<br>Ex. 4-3 | 40°<br>Ex. 4-4 | 50°<br>Ex. 4-5 | 55°<br>Ex. 4-6 | 60°<br>Comp. Ex. 4-2 |
| --- | --- | --- | --- | --- | --- | --- | --- | --- |
| Number of surviving subcells | 1.0 | 1 | 1.0 | 1.0 | 1.0 | 1.0 | 1.0 | 0.85 |
| Photoelectric conversion efficiency | 0.8 | 1 | 1.1 | 1.2 | 1.2 | 1.1 | 1.0 | 0.95 |

TABLE 6

| | Comp. Ex. 6-1 | Ex. 6-1 | Ex. 6-2 | Ex. 6-3 | Ex. 6-4 | Ex. 6-5 | Comp. Ex. 6-2 |
| --- | --- | --- | --- | --- | --- | --- | --- |
| High frequency power (mW/cm$^3$) | 10 | 15 | 18 | 20 | 25 | 30 | 40 |
| Spacing of (220) plane | 0.1% | 0.2% | 0.3% | 0.4% | 0.7% | 1.0% | 1.5% |
| Initial photoelectric conversion efficiency (normalized with the value for Example 6-1 being 1) | 0.95 | 1 | 1.1 | 1.2 | 1.2 | 1.0 | 0.85 |
| Number of surviving squares in cross cut tape test (normalized with the value for Example 6-1 being 1) | 0.90 | 1 | 1.1 | 1.1 | 1.1 | 1.0 | 0.75 |
| Variation of photoelectric conversion efficiency in temperature-himidity test (efficiency after test/initial efficiency) | 0.95 | 1.0 | 1.0 | 1.0 | 1.0 | 1.0 | 0.95 |
| Variation of photoelectric conversion efficiency in photodegradation test (normalized with the value for Example 6-1 being 1) | 1.15 | 1 | 1.0 | 1.0 | 1.0 | 1.0 | 1.10 |

What is claimed is:

1. A silicon-based film comprising a crystal phase formed on a substrate, the substrate having a surface shape represented by a function f, wherein the surface shape has a standard deviation of an inclination arctan (df/dx) from 15° to 55° within the range of a sampling length dx from 20 nm to 100 nm, wherein a Raman scattering strength resulting from an amorphous component in the silicon-based film is not more than a Raman scattering strength resulting from a crystalline component in the silicon-based film, wherein a difference between a spacing in a direction parallel to a principal surface of the substrate and a spacing of single crystal silicon is within the range of 0.2% to 1.0% with regard to the spacing of the single crystal silicon, and wherein the difference in spacing is achieved by promoting displacement of silicon atoms adhering to the substrate.

2. The silicon-based film according to claim 1, comprising a crystal of a columnar structure in a thickness direction.

3. The silicon-based film according to claim 1, wherein a percentage of a diffraction strength of (220) plane due to X-ray or electron beam diffraction is 30% or more of a total diffraction strength.

4. The silicon-based film according to claim 1, which is formed by a plasma CVD method using a high frequency.

5. The silicon-based film according to claim 4, wherein the high frequency is not less than 10 MHz but no more than 10 GHz.

6. A photovoltaic element comprising a silicon-based semiconductor layer having at least one pin junction on a support, wherein at least one i-type semiconductor layer comprises the silicon-based film as set forth in any one of claims 1 to 5.

7. The photovoltaic element according to claim 6, wherein the silicon-based semiconductor layer is formed on a substrate comprising at least a first transparent conductive layer stacked on the support, and the first transparent conductive layer has the surface shape represented by the function f.

8. The photovoltaic element according to claim 6, wherein the support is a conductive support.

9. The silicon-based film according to claim 1, wherein the displacement of silicon atoms adhering to the substrate is promoted by activating ion bombardment at an early stage of formation of the silicon-based film.

10. The silicon-based film according to claim 9, wherein the ion bombardment is activated by increasing high frequency power.

11. The silicon-based film according to claim 9, wherein the ion bombardment is activated by introducing an inert gas.

12. The silicon-based film according to claim 11, wherein the inert gas is argon.

13. The silicon-based film according to claim 1, wherein the difference in spacings is achieved by promoting displacement of silicon atoms adhering to the substrate.

* * * * *

UNITED STATES PATENT AND TRADEMARK OFFICE
CERTIFICATE OF CORRECTION

PATENT NO. : 6,812,499 B2
DATED : November 2, 2004
INVENTOR(S) : Takaharu Kondo et al.

It is certified that error appears in the above-identified patent and that said Letters Patent is hereby corrected as shown below:

Column 4,
Line 14, "run" should read -- nm --.

Column 6,
Line 46, "arid" should read -- and --; and
Line 47, "high-frequencypower" should read -- high-frequency power --.

Column 8,
Line 25, "Group m" should read -- Group III --.

Column 9,
Line 22, "exhaust-from" should read -- exhaust from --.

Column 11,
Line 43, "200 nm" should read -- 200 m --.

Column 12,
Line 24, "for," should read -- for --.
Line 28, "the-discharge" should read -- the discharge --; and
Line 50, "difftactometry," should read -- diffractometry, --.

Column 17,
Line 65, "photoclectric" should read -- photoelectric --.

Column 19,
Table 6, "himidity" should read -- humidity --.

Signed and Sealed this

Fourth Day of October, 2005

JON W. DUDAS
*Director of the United States Patent and Trademark Office*